United States Patent
Kamalanathan et al.

(10) Patent No.: US 9,524,777 B1
(45) Date of Patent: Dec. 20, 2016

(54) DUAL PROGRAM STATE CYCLING ALGORITHMS FOR RESISTIVE SWITCHING MEMORY DEVICE

(71) Applicant: Adesto Technologies Corporation, Sunnyvale, CA (US)

(72) Inventors: Deepak Kamalanathan, Santa Clara, CA (US); Ming Kwan, San Leandro, CA (US); Venkatesh Gopinath, Fremont, CA (US); John Jameson, Menlo Park, CA (US)

(73) Assignee: Adesto Technologies Corporation, Santa Clara, CA (US)

( * ) Notice: Subject to any disclaimer, the term of this patent is extended or adjusted under 35 U.S.C. 154(b) by 0 days.

(21) Appl. No.: 15/071,567

(22) Filed: Mar. 16, 2016

Related U.S. Application Data

(60) Provisional application No. 62/175,783, filed on Jun. 15, 2015.

(51) Int. Cl.
*G11C 11/00* (2006.01)
*G11C 13/00* (2006.01)

(52) U.S. Cl.
CPC ......... *G11C 13/0097* (2013.01); *G11C 13/004* (2013.01); *G11C 13/0069* (2013.01)

(58) Field of Classification Search
CPC .................................................. G11C 11/00
USPC ........................................................ 365/148
See application file for complete search history.

(56) References Cited

U.S. PATENT DOCUMENTS

| | | | | |
|---|---|---|---|---|
| 5,142,496 A * | 8/1992 | Van Buskirk | .... | G11C 29/50004 365/104 |
| 8,565,019 B2 * | 10/2013 | Honda | ................ | G11C 11/5628 365/185.03 |
| 8,838,881 B2 * | 9/2014 | Patapoutian | ........ | G06F 12/0246 711/103 |
| 8,912,517 B2 * | 12/2014 | Van Buskirk | ...... | G11C 13/0004 257/2 |
| 8,995,167 B1 | 3/2015 | Kim et al. | | |
| 9,165,644 B2 | 10/2015 | Kamalanathan et al. | | |
| 2009/0129157 A1 * | 5/2009 | Honda | ................ | G11C 11/5628 365/185.03 |
| 2013/0232291 A1 * | 9/2013 | Patapoutian | ........ | G06F 12/0246 711/103 |
| 2014/0084232 A1 * | 3/2014 | Van Buskirk | ...... | G11C 13/0004 257/2 |

* cited by examiner

*Primary Examiner* — Harry W Byrne
(74) *Attorney, Agent, or Firm* — Michael C. Stephens, Jr.

(57) ABSTRACT

A method of controlling a resistive switching memory cell can include: receiving a first command to be executed on the resistive switching memory cell; performing, in response to the first command, an erase operation to erase the resistive switching memory cell to an erased state; verifying the erased state of the resistive switching memory cell; performing a weak program operation to program the resistive switching memory cell to a first programmed state; and verifying the first programmed state of the resistive switching memory cell.

20 Claims, 14 Drawing Sheets

DUAL PROGRAM STATE CYCLING ALGORITHMS FOR RESISTIVE SWITCHING MEMORY DEVICE

RELATED APPLICATIONS

This application claims the benefit of U.S. Provisional Application No. 62/175,783, filed Jun. 15, 2015, and which is incorporated herein by reference in its entirety.

FIELD OF THE INVENTION

The present invention generally relates to the field of semiconductor devices. More specifically, embodiments of the present invention pertain to memory devices, such as flash memory devices, including resistive random-access memory (ReRAM), and/or conductive bridging RAM (CBRAM) processes and devices.

BACKGROUND

Non-volatile memory (NVM) is increasingly found in applications, such as solid-state hard drives, removable digital picture cards, and so on. Flash memory is the predominant NVM technology in use today. However, flash memory has limitations, such as a relatively high power, as well as relatively slow operation speed. Other NVM technologies, such as resistive switching memory technologies that include resistive RAM (ReRAM) and conductive bridging RAM (CBRAM), may offer relatively lower power and higher speeds as compared to flash memory technologies. For example, CBRAM utilizes a conductive bridging cell technology, which has the potential to scale to smaller sizes than flash memory devices.

DETAILED DESCRIPTION OF EMBODIMENTS

Reference will now be made in detail to particular embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, processes, components, structures, and circuits have not been described in detail so as not to unnecessarily obscure aspects of the present invention.

Some portions of the detailed descriptions which follow are presented in terms of processes, procedures, logic blocks, functional blocks, processing, schematic symbols, and/or other symbolic representations of operations on data streams, signals, or waveforms within a computer, processor, controller, device, and/or memory. These descriptions and representations are generally used by those skilled in the data processing arts to effectively convey the substance of their work to others skilled in the art. Usually, though not necessarily, quantities being manipulated take the form of electrical, magnetic, optical, or quantum signals capable of being stored, transferred, combined, compared, and otherwise manipulated in a computer or data processing system. It has proven convenient at times, principally for reasons of common usage, to refer to these signals as bits, waves, waveforms, streams, values, elements, symbols, characters, terms, numbers, or the like.

Example CBRAM Cell Structure and Architecture

Particular embodiments may be directed to resistive switching memories (e.g., conductive bridging random-access memory [CBRAM], resistive RAM [ReRAM], etc.). The invention, in its various aspects, will be explained in greater detail below with regard to exemplary embodiments. Particular embodiments can include structures and methods of operating resistive switching memories that can be programmed/written and erased between one or more resistance and/or capacitive states. Resistive switching memory devices can include a plurality of resistive memory cells with "programmable impedance elements" or any type of resistive switching or resistance-change memory cells or elements.

Figure 1:
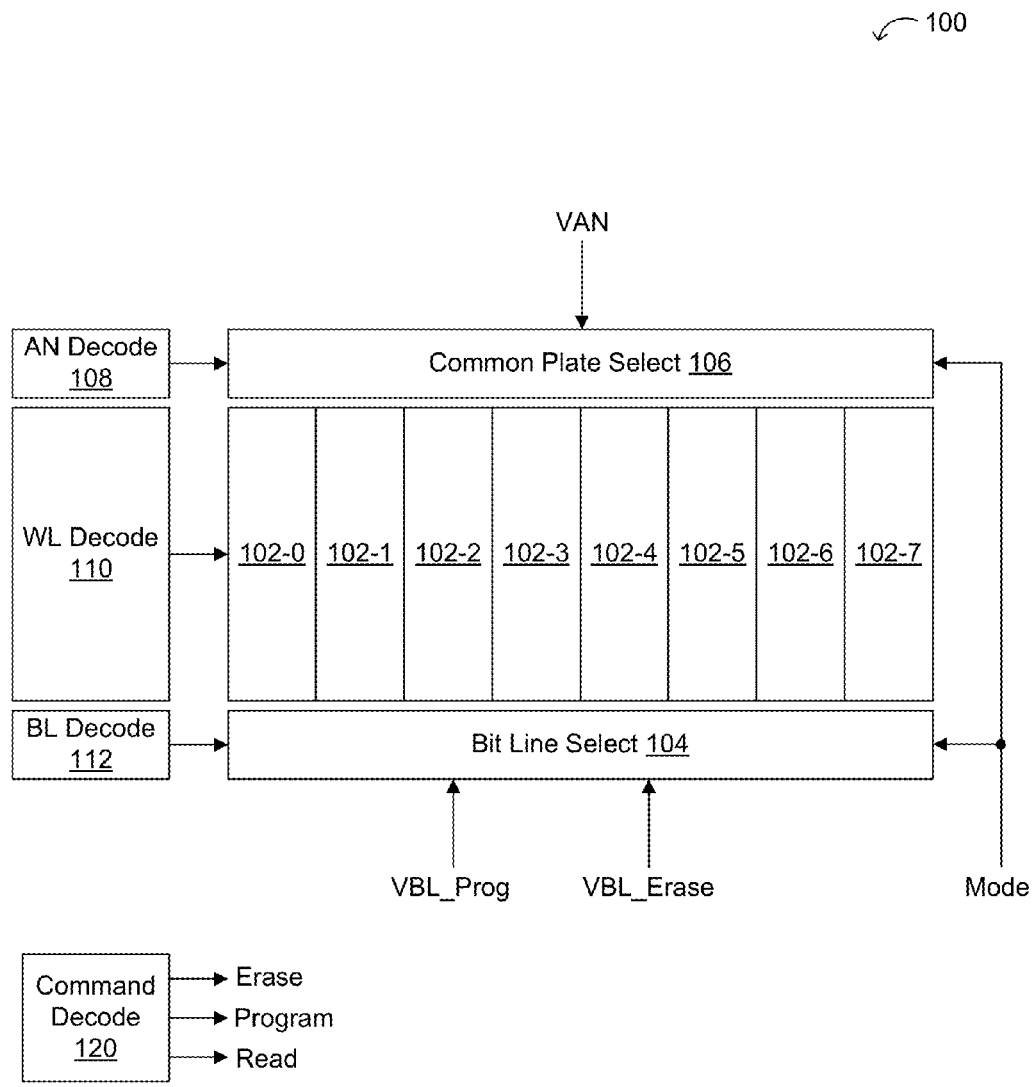
FIG. 1 is an example memory device arrangement.
Figure 2:
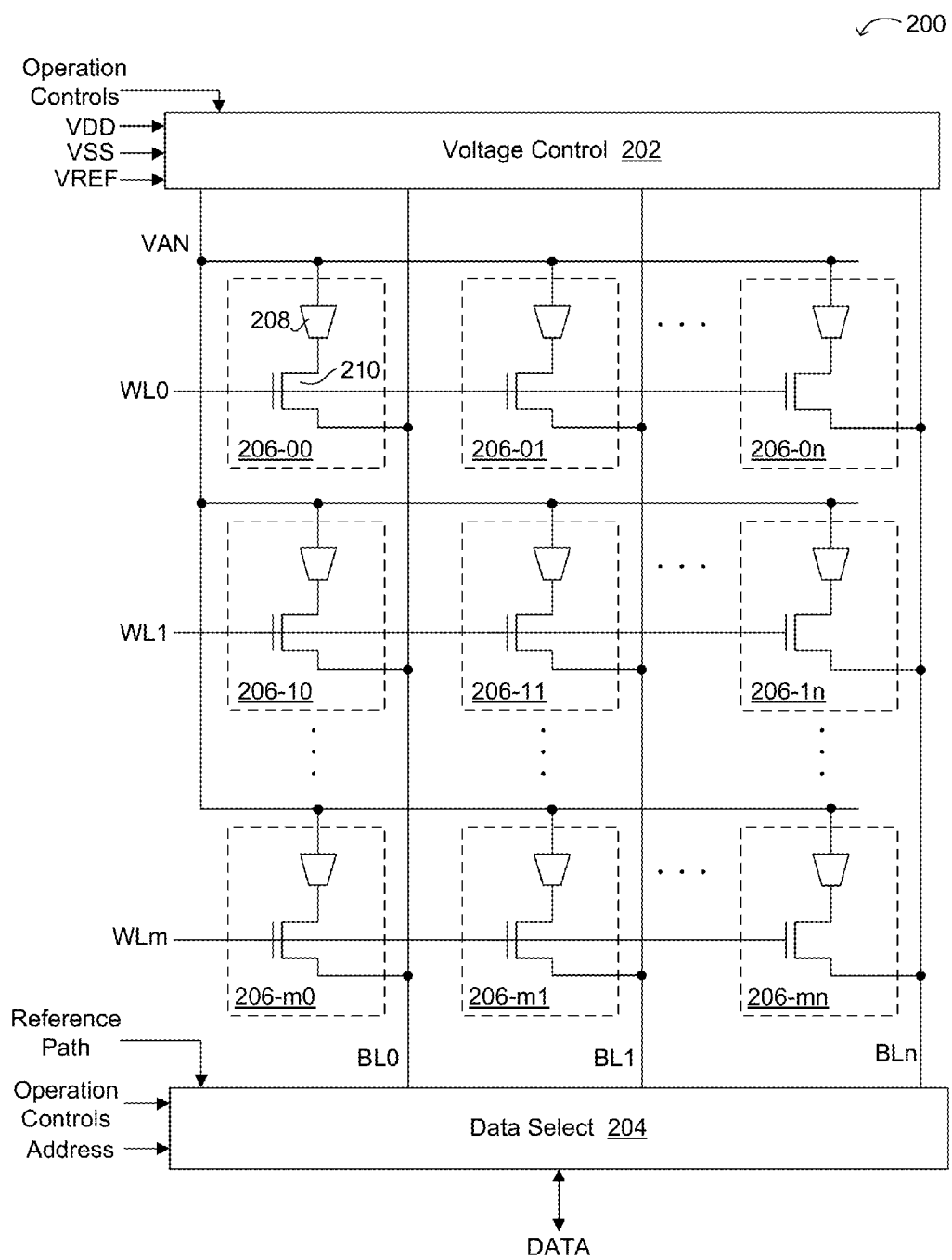
FIG. 2 is a schematic block diagram of an example common anode array structure.

FIGS. 1 and 2 show example memory architectures and circuit structures that can utilize programmable impedance elements. However, particular embodiments are amenable to a wide variety of memory architectures, circuit structures, and types of resistive switching memories.

Referring now to FIG. 1, an example memory device is shown and designated by the general reference character 100. A memory device 100 can include common anode sectors 102-0 to 102-7, bit line selection circuitry 104, common plate selection circuitry 106, anode decoding circuitry 108, word line decoding circuitry 110, and bit line decoding circuitry 112. A memory device 100 can be a single integrated circuit, or may form a portion of a larger integrated circuit device that provides functions in addition to memory, such as in an "embedded" memory configuration.

FIG. 1 may also include command decoding circuitry 120. For example, command decoding circuitry 120 may receive external signals, or control signals derived therefrom, and may generate various internal control signals (e.g., program, erase, read, etc.) in response. Such internal operation control signals can be used to generate various supply levels (e.g., particular program and erase voltage levels), as well as other control signals (e.g., erase operation control signals), as will be discussed in more detail below. In this way, command decoding circuitry 120 may be used to determine an operation to be performed on the device.

Common anode sectors (102-0 to 102-7) can each include a number of memory cells arranged into one or more columns and multiple rows, and coupled to a common anode plate. Each memory cell can include one or more programmable impedance elements or CBRAM storage elements, and a selection device. Generally, a CBRAM storage element may be configured such that when a bias greater than a threshold voltage is applied across electrodes of the CBRAM storage element, the electrical properties of the CBRAM storage element can change. For example, in some arrangements, as a voltage is applied across the electrodes of the CBRAM storage element, conductive ions within an ion conductor may begin to migrate and form an electrodeposit at or near the more negative of the electrodes. Such an electrodeposit, however, is not required to induce a change in electrical properties. The term "electrodeposit" as used herein means any area within the ion conductor that has an increased concentration of reduced metal or other conductive material compared to the concentration of such material in the bulk ion conductor material. As the electrodeposit forms, the resistance between the electrodes can decrease, and other electrical properties may also change. If a voltage is applied in reverse, the electrodeposit can dissolve back into the ion conductor and a device can return to a former electrical state (e.g., high resistance state).

Voltages VBL_Prog, VBL_Erase, and VAN may be conventional power supply voltages, such +5 and 0 volts, or +3.3 and 0 volts, or +1.2 and 0 volts. In one example, such voltages may be one or more power supply voltages received at an external pin of an integrated circuit including memory device 100. In another example, such voltages may be one or more voltages generated by a voltage regulator of an integrated circuit that includes memory device 100. In any event, such voltages may be used, either directly or indirectly, for programming (e.g., in a forward bias configuration) or erasing (e.g., in a reverse bias configuration) a CBRAM cell by applying suitable voltages across the electrodes thereof.

Bit line selection circuitry 104 can selectively connect bit lines of one or more common anode sections (102-0 to 102-7) according to a mode of operation and bit line decoding values. In one particular example, bit line selection circuitry 104 can advantageously connect a selected bit to either of voltages VBL_Prog or VBL_Erase. That is, in a program operation, a selected bit line can be connected to voltage VBL_Prog, while in an erase operation, a selected bit line can be connected to voltage VBL_Erase.

Common plate selection circuitry 106, can connect anode plates to an inhibit voltage for CBRAM cells that are not selected (e.g., via anode decode 108) for erase or program. It is noted that an arrangement like that shown in FIG. 1 can advantageously provide program and erase voltages without having to include charge pumps or the like, to a voltage that is outside a power supply range, as may exist in other approaches. Instead, supply voltages applied across a selected CBRAM device can be switched between program and erase operations. In this way, program and erase can be "symmetric" operations. That is, in a programming operation, a CBRAM cell to be programmed can be connected between suitable voltages (e.g., V1-V2) in an anode-to-cathode direction. In an erase operation, a CBRAM cell to be erased can be connected between suitable voltages (e.g., V2-V1) in a cathode-to-anode direction.

Bit line decoding circuitry 112 can generate values for selecting given bit lines for read, program, and erase operations. In one arrangement, in response to address information (e.g., column address data), bit line decoding circuitry 112 can generate bit line select signals for application to bit line select circuitry 104. Word line decoding circuitry 110 can generate values for selecting a given set of memory cells by enabling access devices in one or more selected rows of common anode sections (102-0 to 102-7). In response to address information (e.g., row address data), one or more word lines can be driven to a select voltage to thereby enable the corresponding select device (e.g., a transistor) in a row of memory cells.

Referring now to FIG. 2, shown is a schematic block diagram of an example common anode array structure 200, which can be one implementation of the example shown in FIG. 1. In this example, voltage control 202 can receive various supply voltages (e.g., VDD, VSS, VREF, etc.), as well as operation controls (e.g., program, erase, verify, read, etc.). Resistive memory cells 206 can include a programmable impedance element 208 and an access transistor 210, as shown. In this particular arrangement, the anode of each memory cell 206 can connect together in a common anode structure. For example, the common anode can be a large plate structure that may be biased at a voltage VAN generated by voltage control 202. Of course, other voltage generation control and regulated levels, as discussed above, can be utilized in certain embodiments.

In this example, data select 204 can provide an interface between the bit lines (BL0, BL1, . . . BLn) and a data path that is coupled to a sensing or amplification block, as well as to write circuitry. Address decoding can be used to determine which of the bit lines are mapped to the data lines in a particular access cycle. Other types of addressing or decoding (e.g., anode-based decoding) can also be employed. For example, the common anode structure as shown can be broken up into a plurality of sub blocks of common anodes, and each of these may be addressed and decoded. In addition, word line (WL0, WL1, . . . WLm) decoding can be utilized for activation of the appropriate word line for a given cycle.

Further, a reference path can also be coupled to data select 204. The reference path can be used by a sensing circuit in order to compare against a regular bit line. For example, a current from a selected bit line and its selected memory cell 206 can be compared against a current from a reference bit line, where the reference bit line is biased such that appropriate data states on the selected memory cell via the selected bit line can be detected. In one application, the capacitance on the reference bit line and reference memory cell structure can match the capacitance on a regular memory cell/bit line such that these effects are negated during the sensing process.

Other architectures can also be employed with sensing circuitry, arrangements, and methods of particular embodiments. For example, a common cathode structure, whereby a plurality of memory cells are coupled together via a common cathode connection, can be supported. In such a case, the access transistor may connect the anode to the corresponding bit line in a bit line anode arrangement. Also, cathode-based decoding can be used in such an arrangement. Another example architecture or memory cell arrangement is a strapped source structure. In any event, particular embodiments are suitable to a wide variety of resistive memory cell architectures and arrangements.

Data select 204 can also receive operation control signals. These signals can be used to set a read data path, a write data path, and sensing circuitry, as appropriate for the given command. For example, a read data path may be activated for a read operation, a program verify operation, or an erase verify operation. Also, a write data path may be activated for a program or erase operation. For example, a common bidirectional sensing circuit can be employed in each of these operations. In particular, the bidirectional sensing circuit can allow for a program verify to be performed using a same forward bias (anode voltage higher with respect to cathode voltage) on the memory cell as was used to program the memory cell. Similarly, the bidirectional sensing circuit can allow for an erase verify to be performed using a same reverse bias (cathode voltage higher with respect to anode voltage) on the memory cell as was used to erase the memory cell.

Sensing circuits in particular embodiments also aim to minimize disturbance of the accessed cell resistance during the read operation to determine a data state from that cell. Thus, a cell that is programmed (e.g., in a data state "0") should remain in that state after a program verify or standard read operation, and a cell that is erased (e.g., in a data state "1") should remain in that state after an erase verify or standard read operation. The CBRAM cell may generally be programmed with a forward bias voltage (positive with respect to anode and cathode), and may be erased with a reverse bias voltage (negative with respect to anode and cathode). Various voltages for bit lines and the common anode plate can be supported in particular embodiments. Voltages can also be changed depending on the bias direction (forward or reverse) for a read operation.

Having described the various sections of FIG. 2, one example of the operation of such a memory device will now be described with reference to an operation that accesses memory cell 206-00. Initially, word lines WL0, WL1, . . . WLm can be driven to a de-select voltage (e.g., low) by associated word line drivers. Bit line selection circuitry 104 can place bit lines BL0 and BL1 in the de-selected state. Similarly, common plate selection circuitry 106 can place common anode plates in the de-select state.

In a program operation, in response to address and mode data, bit line selection signals can be used to connect a selected bit line to read/write control circuitry via data select 204. In contrast, other bit lines can be de-selected, and thus placed in the de-selected state. Mode selection values can result in read/write control circuitry connecting the selected bit line (e.g., BL0) to a cathode program voltage. A program operation can also include anode plate voltage VAN being connected to a program voltage, while connecting the selected bit line is grounded. A word line driver corresponding to the selected memory cell can be driven to a select voltage, thereby placing the selected memory cell between suitable programming voltages.

An erase operation can occur in the same general fashion, but with the erase voltage being applied to the selected bit line and common anode voltage VAN. As noted in the example of FIG. 1, in particular embodiments, such an operation can be symmetrical. Also, while FIG. 2 shows n-channel MOS transistors 210 as access devices, other embodiments may include different types of access devices. In such alternate embodiments, associated word line drivers would provide appropriate voltage and/or currents to enable such access devices. In this way, bit line selection, anode plate selection, and word line activation can be utilized to program and/or erase a CBRAM array having bit lines connected to cathodes of CBRAMs within multiple memory cells.

While particular example architectures and circuits suitable for CBRAMs, and memory arrays formed thereof, with respect to FIGS. 1 and 2, programmable impedance elements in certain embodiments are suitable to a wide variety of architectures and/or circuit arrangements.

Figure 3:
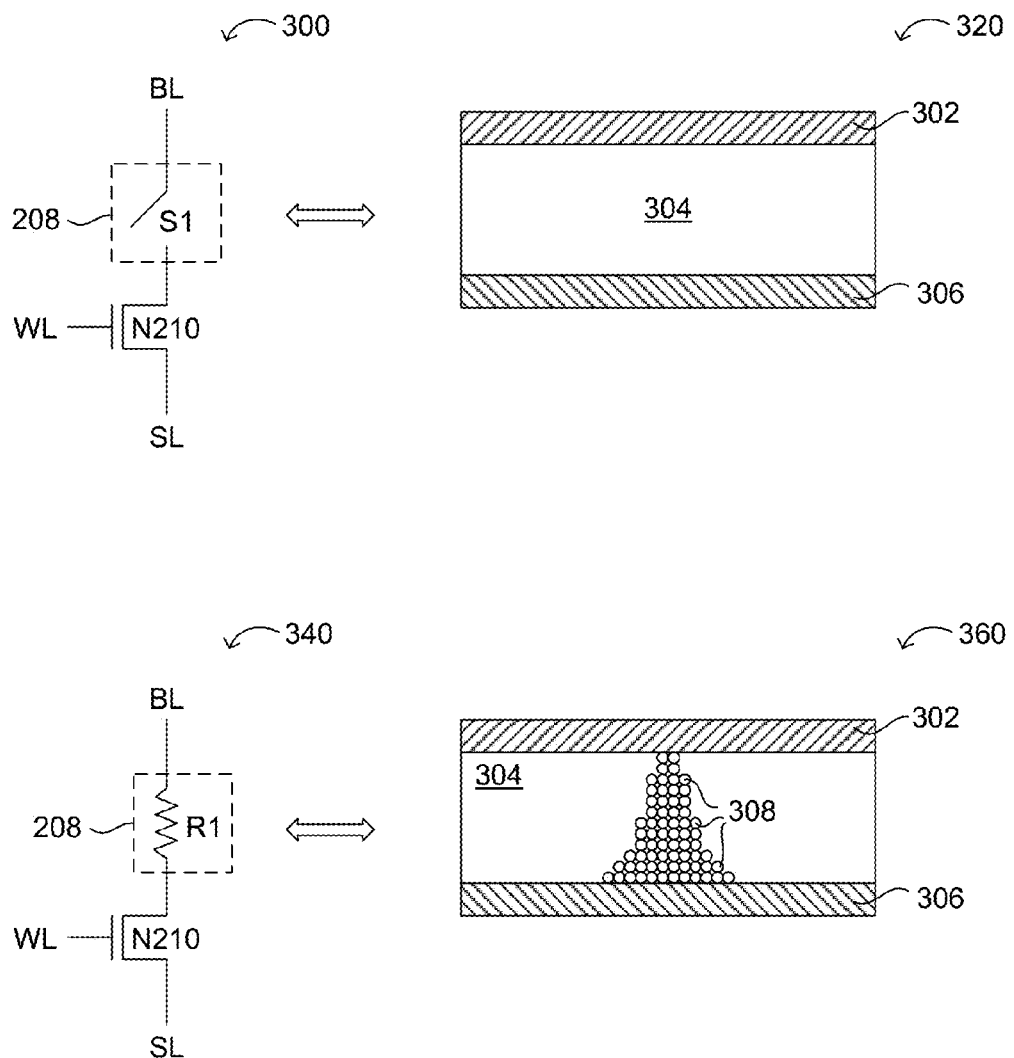
FIG. 3 is a diagram of an example programmable impedance element with schematic modeling.

Referring now to FIG. 3, shown is a diagram of an example programmable impedance element with schematic modeling. For example, example 300 shows a memory cell with an open switch S1 representation of programmable impedance element 208. The programmable impedance element or CBRAM storage element portion of this representation corresponds to the cross-section diagram 320, which represents a resistive storage element in a high impedance state (e.g., data state "1"), or an erased state. Particular embodiments can also include any type of resistive switching or resistance-change memory cells or elements. In one example, CBRAM storage element 320 can include electrochemically active electrode 302, solid electrolyte 304, and inert electrode 306. The example CBRAM storage element 320 may represent a strong or substantially erased state of the cell. As shown, substantially no conductive path between active electrode 302 and inert electrode 306 is seen in CBRAM storage element 320.

Schematic representation 340 and corresponding cross-section diagram 360 show examples of CBRAM storage element 208 in a low impedance state (e.g., data state "0"), or a programmed state. For example, example 340 shows a memory cell with a resistor R1 or closed switch representation of CBRAM storage element 208. The CBRAM storage element portion of this representation corresponds to the cross-section diagram 360. In the example 360, electrodeposits 308 can form in solid electrolyte 304 to form a "bridge" or conductive path between electrochemically active electrode 302 and inert electrode 306 to program the memory cell. For example, electrodeposits 308 can be from active electrode 302, and may include silver, copper, titanium, or tellurium, as just a few examples. As shown in example CBRAM storage element 360, a full conductive path may be formed between active electrode 302 and inert electrode 306 by electrodeposits 308.

As shown in examples 300 and 340, a control transistor (e.g., 210) can also be included in each memory cell including the programmable impedance element or CBRAM storage element 208. For example, transistor 210 can be controlled by a word line, as discussed above with respect to FIG. 2. Transistor 210 may be an access transistor to allow CBRAM storage element 208 to be programmed, read, and erased.

Cell data can be erased in similar fashion to cell programming, but with a positive bias on the inert electrode. The metal ions will then migrate away from the filament, back into the electrolyte, and eventually to the negatively-charged active electrode (e.g., 302). This action dissolves the electrodeposits 308 in solid electrolyte 304, and increases the resistance again (e.g., as shown in schematic representation 300). In this way, an erase operation of a CBRAM storage element may be substantially symmetric to a program operation.

Example Dual Program State Cycling Algorithms

Many CBRAM/ReRAM program and erase operations may lose some effectiveness after certain high temperature processes. For example, a surface-mount technology (SMT) process whereby semiconductor memory device components are mounted on a printed-circuit board (PCB) can cause degradation in the conductive path of electrodeposits 308 formed between electrodes 302 and 306 in some cases. Thus, such a high temperature process may cause the resistance between these electrodes to increase, potentially putting a stored data state of "0" at risk. In other cases, such a high temperature process can cause the resistance to decrease, potentially putting a stored data state "1" at risk.

For example, such a high temperature process can include an SMT process where the semiconductor memory device is soldered onto a PCB. In some cases, the device may be exposed to temperatures of, e.g., about 250° C. for a time from about 5 minutes to about 10 minutes. Certain applications (e.g., firmware), may desire the semiconductor memory device or chip (e.g., CBRAM, ReRAM, etc.) to be programmed prior to the SMT process. In another consideration, favorable cost reductions can occur if chips are programmed/written at a wafer level that is also prior to the SMT process. Other considerations can include asserting control over code or firmware by programming data prior to the SMT process such that a subsequent or end user does not have access to the code/firmware. Thus for many reasons, a resistive switching memory device may be written (programmed/erased) prior to undergoing an SMT process.

Particular embodiments can include a selectable operation algorithm for executing a program or erase command by performing one or more of a plurality of program and erase operations. Thus, a command supplied to a memory device and decoded (e.g., via command decoder 120) as a program may be carried out on a semiconductor memory device according to the selected program operation algorithm. Further, the selected program operation algorithm can include one or more program, and possibly erase operations, each with conditions determinable by option variables, which may be accessible from a register. Similarly, a command decoded as an erase command may be carried out on a semiconductor memory device according to the selected erase operation algorithm. Further, the selected erase operation algorithm can include one or more of erase, and possibly program operations, each with conditions determinable by option variables, which may be accessible from a register. In addition, a retry operation can be included in some of the program and erase operations, as defined by the particular algorithm. In a retry operation, a previous program or erase operation is repeated if not fully successful up until a maximum retry count value is reached.

As discussed herein "algorithms" can include one or more of write operation control algorithms, testing algorithms, methods, operations and/or procedures, such as one or more of a plurality of program and erase operations or pulses in order to carry out a program or erase command. For example, one or more operations can include a series of program pulses with verifies in between and/or a series of erase pulses with verifies in between, and/or various combinations thereof, such as including "strong" program/erase pulses and "weak" program/erase pulses. Also, program/erase voltages and/or pulse widths may also be adjusted as a number of pulses or attempts increases. As another example, the write algorithms can include weak and strong program operations (e.g., with different word line voltages), and a standard erase operation.

Figure 4:
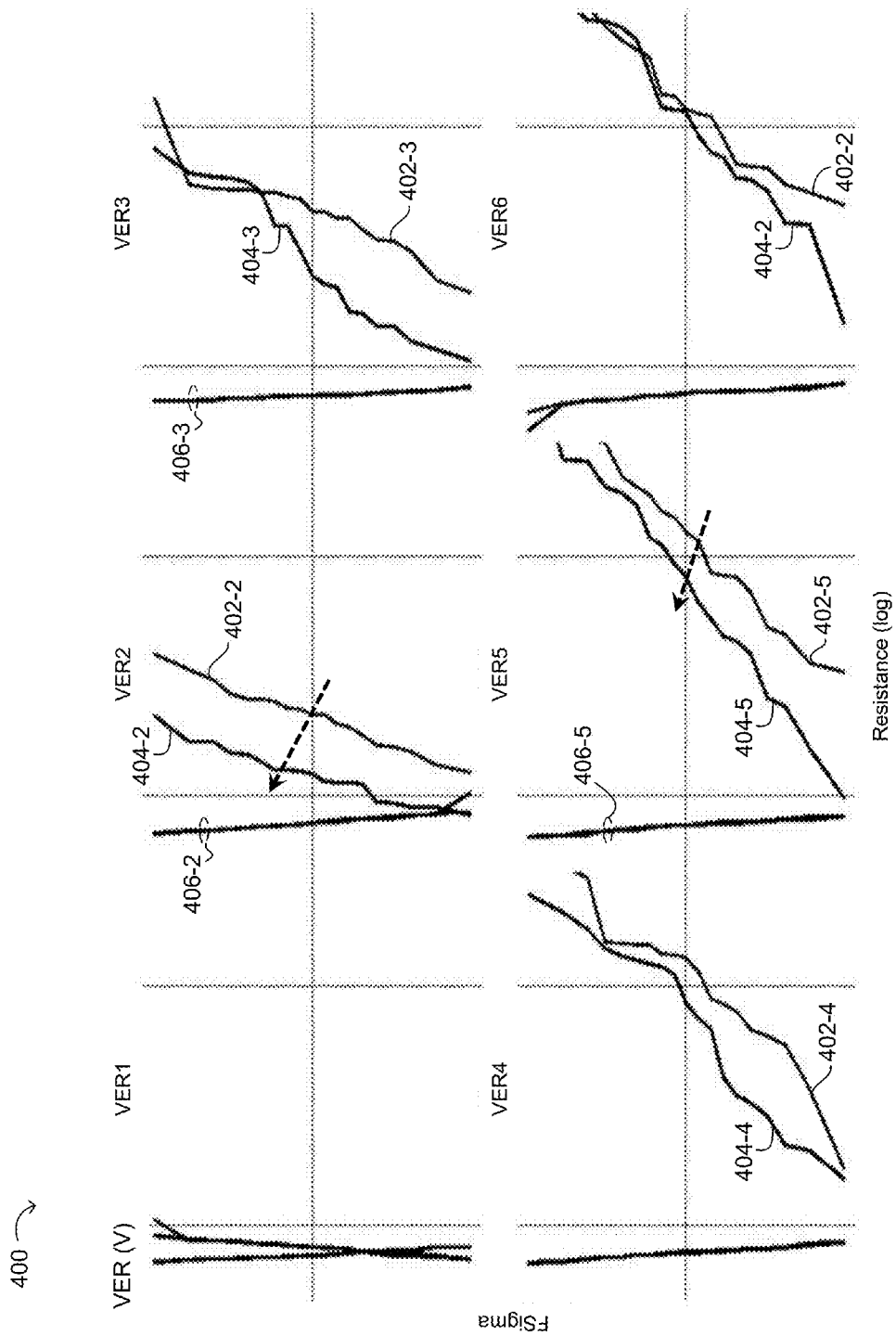
FIG. 4 is a diagram of example program and erase retention versus word line erase voltage.

Referring now to FIG. 4, shown is a diagram 400 of example program and erase retention versus word line erase voltage. Here, there is substantial no program or low resistance state movement with SMT (see, e.g., 406-2, 406-3, and 406-5), though a higher erase voltage (e.g., VER), such as including a higher word line voltage during erase operations, can increase the incoming erase resistance. Also, such a higher word line voltage may not substantially change the behavior or erase resistance distribution through an SMT process. The erase resistance distribution may be irrespective of the erase state achieved, and the erase resistance can be reduced after an SMT process. As shown, 402 shows before a bake/SMT process has occurred, and 404 shows after such bake/SMT process.

Figure 5:
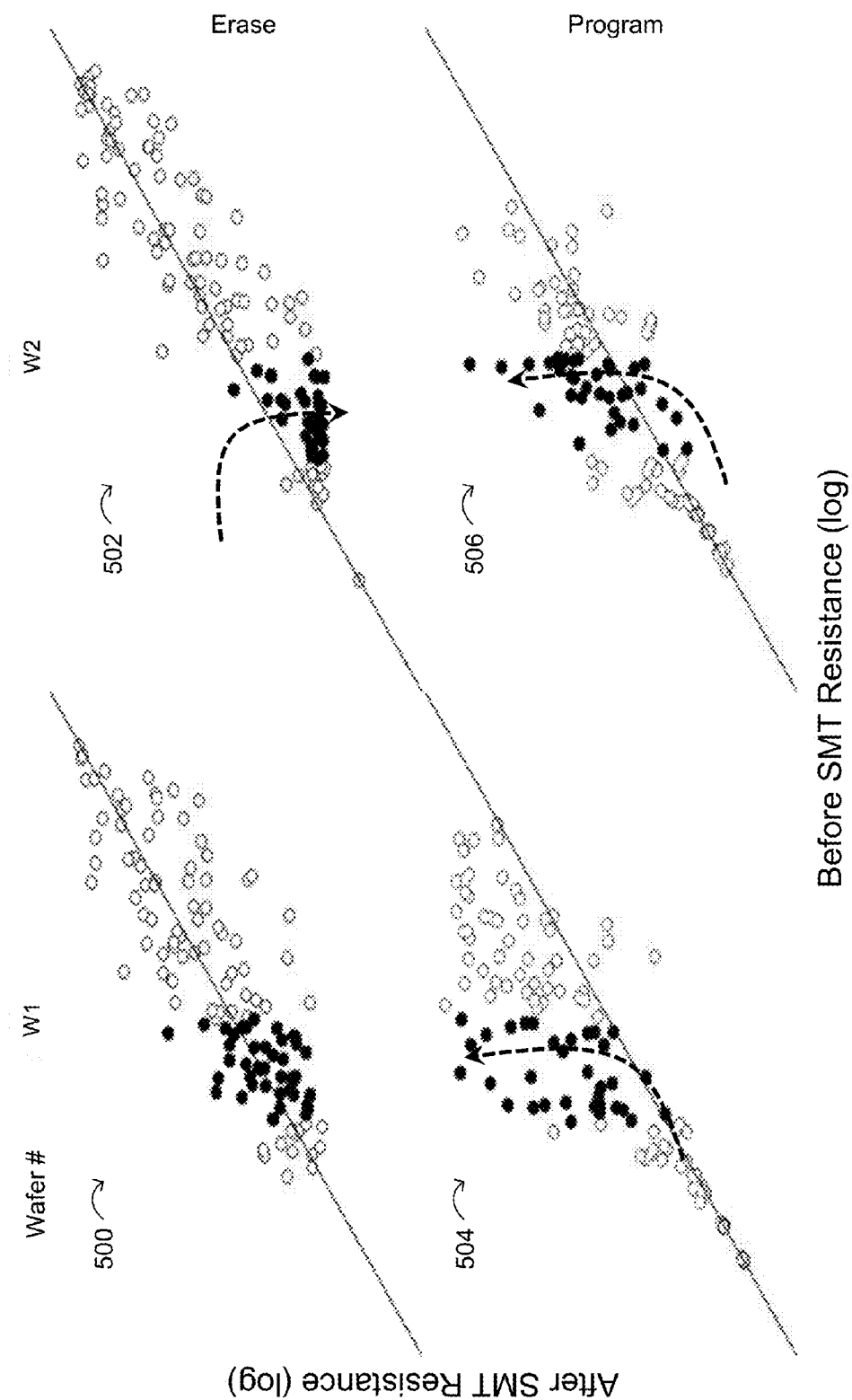
FIG. 5 is a diagram of example retention versus resistance values.

Referring now to FIG. 5, shown is a diagram of example retention versus resistance values for two different material systems. Resistances achieved between from about 100 kΩ to about 1 MΩ may behave differently with respect to an SMT process, such as depending on whether the resistance state was achieved as a result of a program operation or an erase operation. For example, resistances between from about 100 kΩ to about 1 MΩ achieved through an erase operation may reduce in resistance after an SMT process (see, e.g., 500 and 502), while resistances achieved in this range through a program operation can increase in resistance after the SMT process (see, e.g., 504 and 506).

Figure 6:
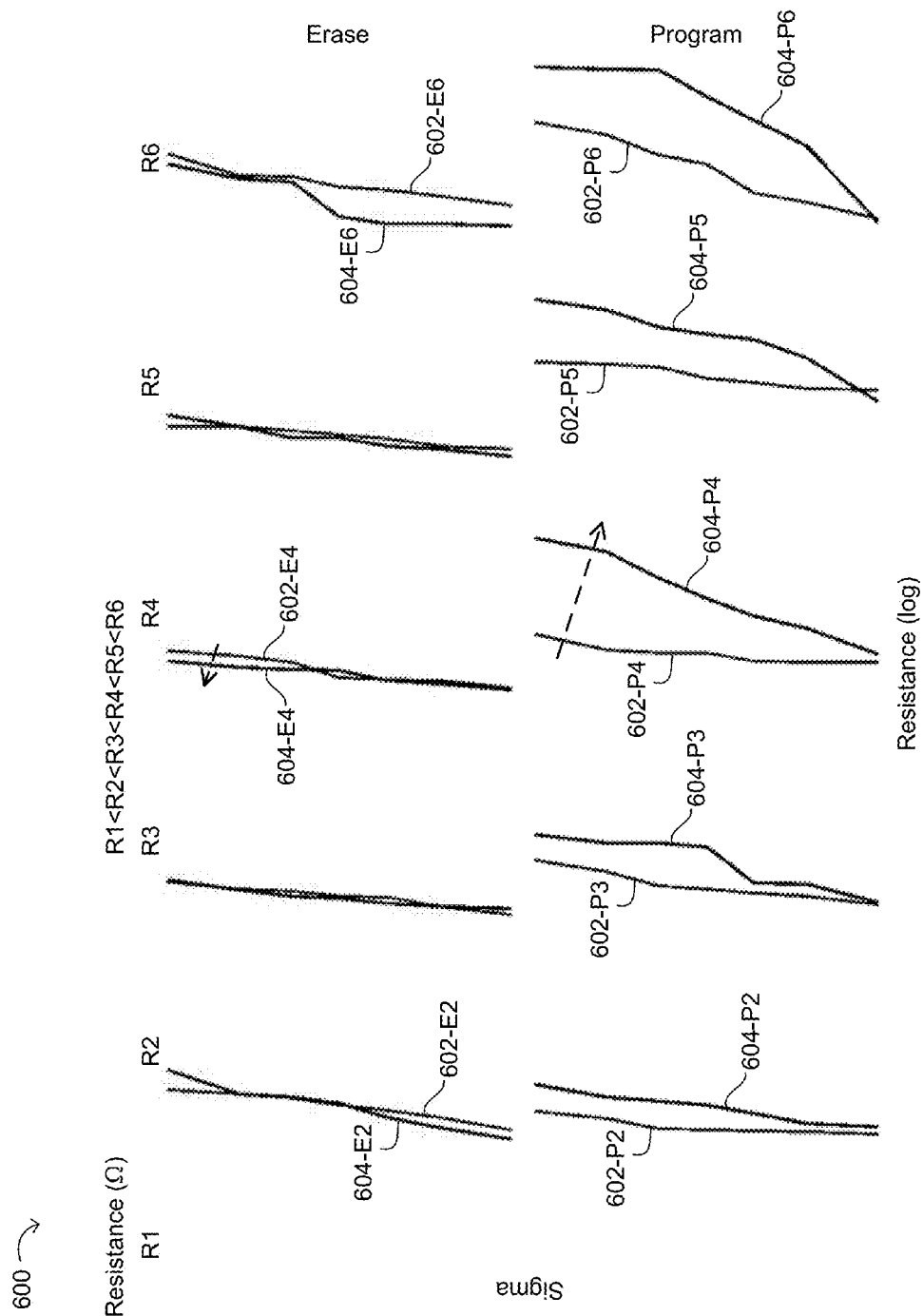
FIG. 6 is another diagram of example retention versus resistance values.

Referring now to FIG. 6, shown is another diagram 600 of example retention versus resistance values and how it depends on the previously performed operation in order to get to that resistance value. In particular embodiments, a weakly programmed state (e.g., to a resistance of about 50 kΩ) instead of an erased state can be employed for a logic "1" data state, and a strongly programmed state (e.g., to a resistance of about 10 kΩ) can be employed for a logic "0" data state. In some cases, a state resulting from an erase operation can be considered a "don't care" or "x" data state, or any other predetermined third data/logic state. Thus in particular embodiments, while two programmed data states can be provided, a third erased data state may also be provided. Further, the same resistance state obtained through a weak program operation may increase in value after SMT, which can result in a better margin between itself and its corresponding strong program state. In the diagram, 602 shows examples before a bake/SMT process has occurred, and 604 shows such examples after the bake/SMT process.

Figure 7:
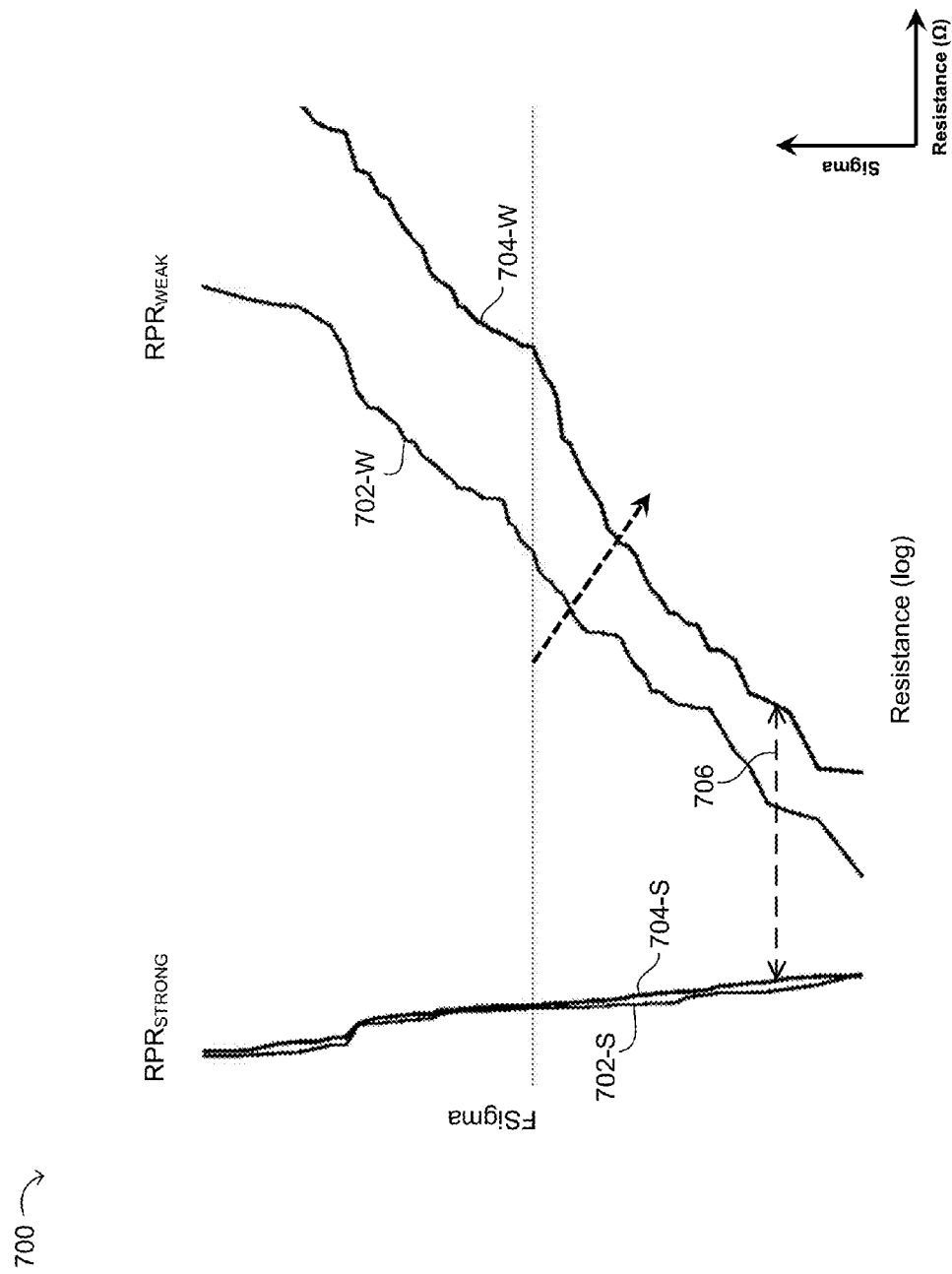
FIG. 7 is a diagram of example dual program states, in accordance with embodiments of the present invention.

Referring now to FIG. 7, shown is a diagram 700 of example dual program states, in accordance with embodiments of the present invention. In this particular example, such data can be obtained from 64 bits across one or more mini arrays, although any array access size or number of activated sense amplifiers for verify operations can be supported in certain embodiments. In this particular example, a weakly programmed state can serve as a high resistance state (e.g., logic "1" data state) instead of a traditional erased state with a much higher resistance (e.g., about 1 MΩ). Thus as discussed above, two programmed states (e.g., due to weak and strong program operations), as well as one traditional erased state (e.g., due to a regular erase operation) can be supported in particular embodiments.

Here, the left portion of the diagram shows example resistances of strong program operations (e.g., 702-S before bake/SMT, and 704-S after bake), and the right portion of the diagram shows example resistances of weak program operations (e.g., 702-W before bake/SMT, and 704-W after bake). In addition, instead of the regular erased state whereby the resistance is about 1 MΩ, an "erased" state in particular embodiments (e.g., via a weak program operation) can have a much lower resistance, such that write voltages with lower absolute values can be employed. Further, because resistances due to program operations tend to increase after SMT (see, e.g., FIG. 5), data state margin can be maintained by utilizing weak and strong program operations, as opposed to strictly regular program and erase operations. In this way, the resistances corresponding to the two data states can be substantially prevented from moving towards each other (e.g., after SMT), which would reduce the margin between these two states. Instead, an increase in margin (see, e.g., 706) can occur between "0" and "1" data states after going through SMT.

Figure 8:
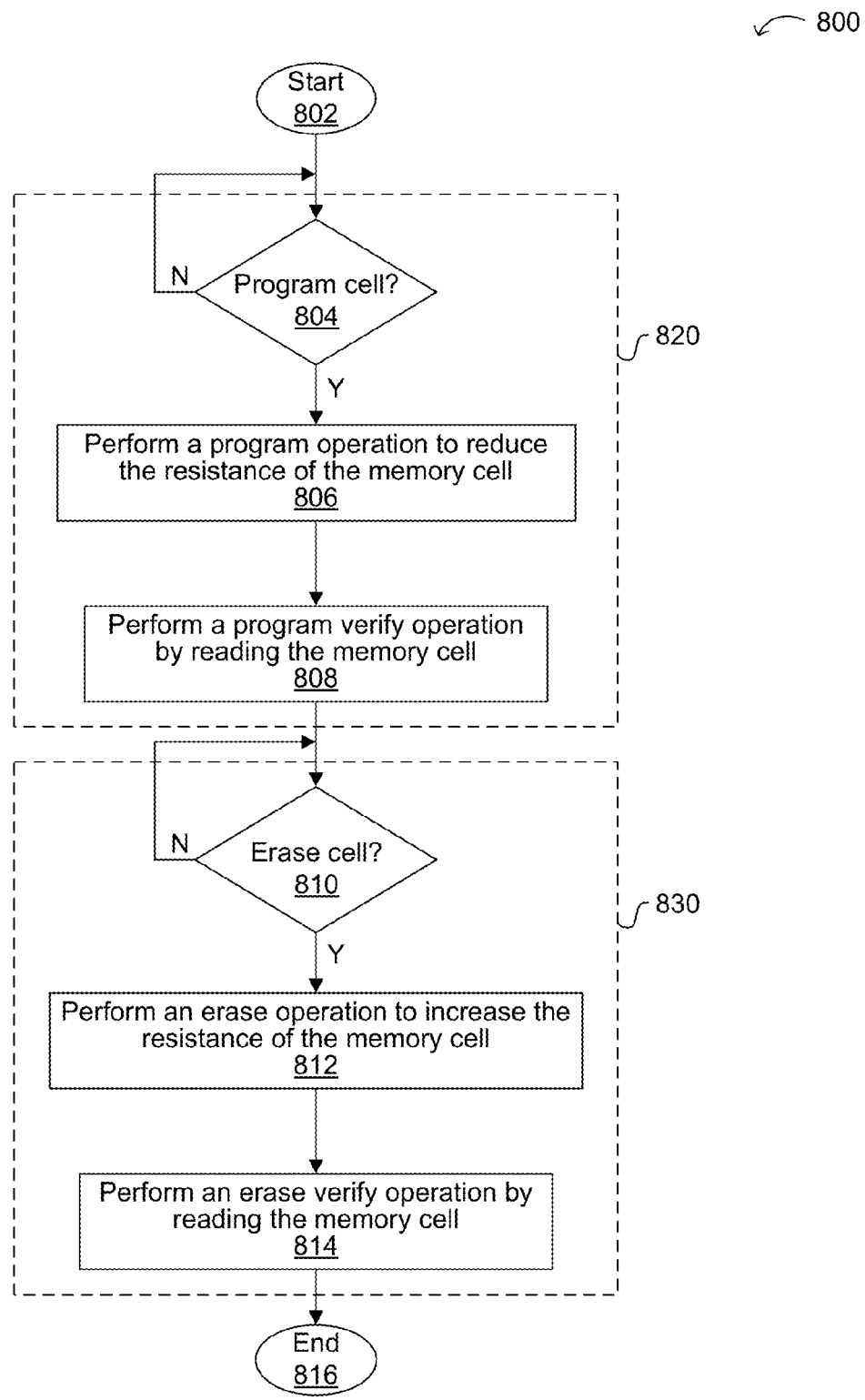
FIG. 8 is a flow diagram of example program and erase algorithms.

Referring now to FIG. 8, shown is a flow diagram 800 of example program and erase algorithms. This example shows regular program and erase operations/algorithms. The flow can begin 802, and if a cell is to be programmed at 804, one or more program operations can be performed in order to reduce the resistance of the memory cell at 806. For example, the program operation can be determined via decoding of externally supplied (e.g., from a host) signals (e.g., via command decoder 120). A read operation (e.g., via a sense amplifier) in order to verify whether the program operation successfully programmed the memory cell can be performed at 808. As part of the verify operation, the resistance of the memory cell can effectively be compared against a target resistance, such that if the determined resistance value is less than the target resistance, then the memory cell may be deemed to have been successfully programmed. Program operation 820 can thus include determining the operation at 804, performing one or more program operations at 806, and performing one or more program verify operations at 808.

If a cell is to be erased at 810, one or more erase operations can be performed in order to increase the resistance of the memory cell at 812. For example, the erase operation can be determined via decoding of externally supplied (e.g., from a host) signals (e.g., via command decoder 120). A read operation in order to verify whether the erase operation successfully erased the memory cell can be performed at 814, and the flow can complete 816. As part of the verify operation, the resistance of the memory cell can effectively be compared against a target resistance, such that if the determined resistance value is greater than the target resistance, then the memory cell may be deemed to have been successfully erased. Erase operation 830 can thus include determining the operation at 810, performing one or more erase operations at 812, and performing one or more erase verify operations at 814.

Figure 9:
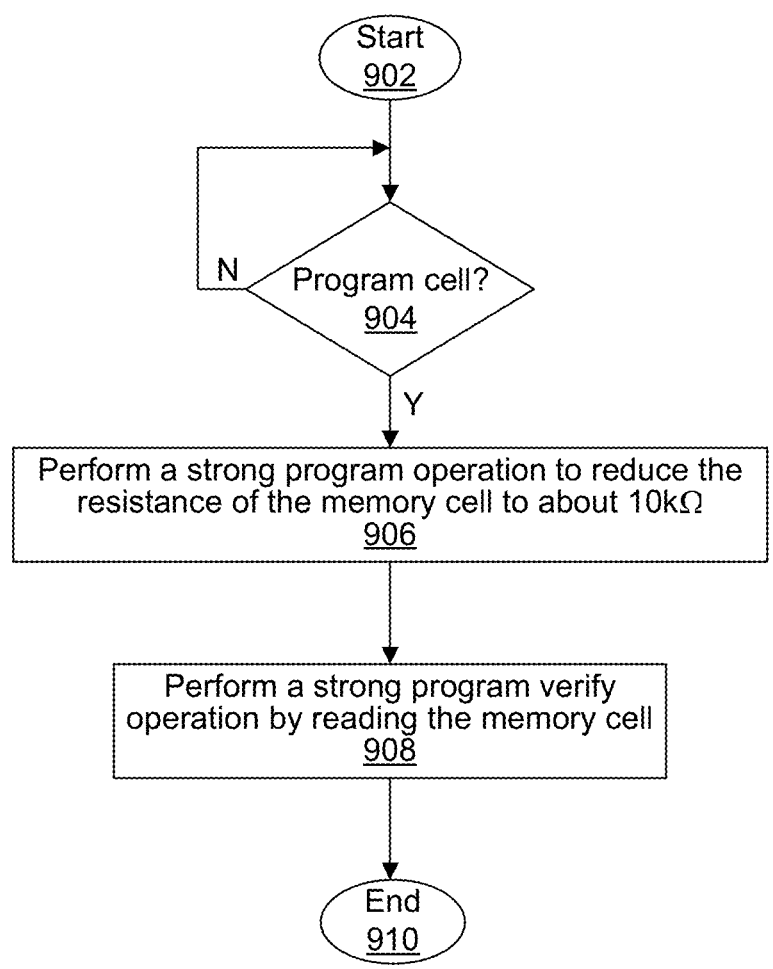
FIG. 9 is a flow diagram of an example method of programming a resistive memory cell to a first programmed state, in accordance with embodiments of the present invention.

Referring now to FIG. 9, shown is a flow diagram of an example method of programming a resistive memory cell to a first programmed state, in accordance with embodiments of the present invention. In particular embodiments, program operation 900 can include "strong" programming of the memory cell. The flow can begin 902, and if a cell is to be programmed at 904, one or more program operations can be performed in order to reduce the resistance of the memory cell to about 10 kΩ at 906. For example, the program operation can be determined via decoding of externally supplied (e.g., from a host) signals (e.g., via command decoder 120). In addition, various option variables or parameters (see, e.g., FIG. 14) can be employed whereby the program operation can be determined/selected to be a strong program operation. In some cases, the strong program operation may be substantially the same as a regular program operation, and in any event can be stronger and may result in a lower cell resistance as compared to a weak program operation.

For example, the strong program operation can include a higher word line level (e.g., about 1 V), as compared to a "weak" program operation having a word line level of about 0.5 V. Other option variables used to implement strong/weak program operations can include pulse widths, program voltages via word lines and bit lines, currents, or any suitable parameter in order to produce the desired strong program effect. A read operation in order to verify whether the strong program operation successfully programmed the memory cell can be performed at 908. As part of the verify operation, the resistance of the memory cell can effectively be compared against a target resistance (e.g., about 10 kΩ), such that if the determined resistance value is less than or about equal to the target resistance, then the memory cell may be deemed to have been successfully strong programmed. Strong program operation 900 can thus include determining the operation at 904, performing one or more "strong" program operations at 906, and performing one or more associated strong program verify operations at 908.

Figure 10:
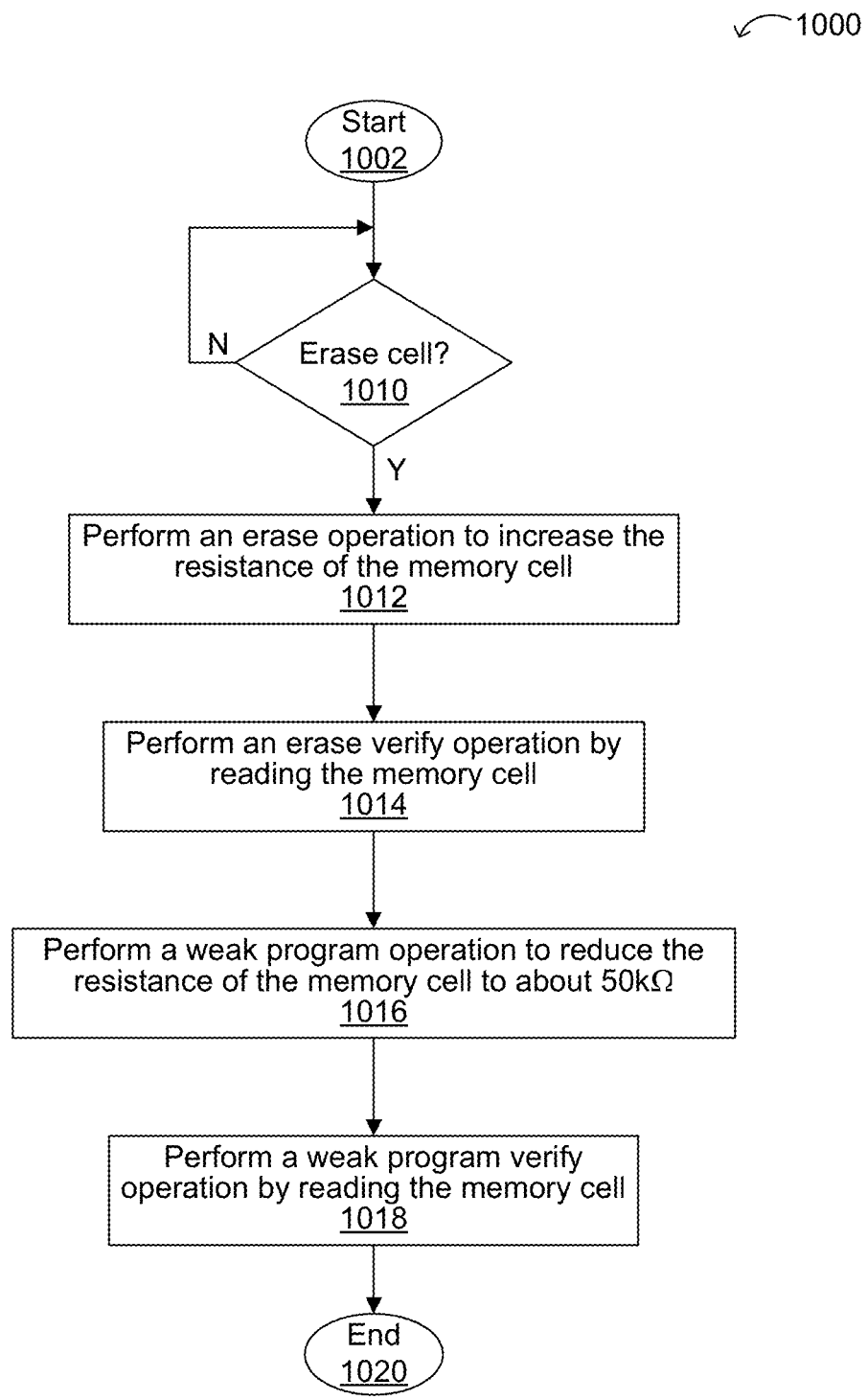
FIG. 10 is a flow diagram of an example method of erasing a resistive memory cell and programming to a second programmed state, in accordance with embodiments of the present invention.

Referring now to FIG. 10, shown is a flow diagram 1000 of an example method of erasing a resistive memory cell and programming to a second programmed state, in accordance with embodiments of the present invention. The flow can begin 1002, and if the memory cell is to be erased at 1010, one or more erase operations can be performed in order to increase the resistance of the memory cell at 1012. For example, the erase operation can be determined via decoding of externally supplied (e.g., from a host) signals (e.g., via command decoder 120). Alternatively, the erase operation can be included as part of a detection of a weak program operation. As another example, such erase operations may be employed prior to weak and/or strong program operations.

A read operation (e.g., via a sense amplifier) in order to verify whether the erase operation successfully erased the memory cell can be performed at 1014. As part of the erase verify operation, the resistance of the memory cell can effectively be compared against a target resistance, such that if the determined resistance value is greater than the target resistance, then the memory cell may be deemed to have been successfully erased. In particular embodiments, erase/program operation 830 can include "weak" programming of the memory cell. One or more program operations can be performed in order to reduce the resistance of the memory cell to about 50 kΩ at 1016. For example, the program operation can be determined via decoding of externally supplied (e.g., from a host) signals (e.g., via command decoder 120). Alternatively, the weak program operation can be included as part of the algorithm based on detection of an erase operation.

In addition, various option variables or parameters (see, e.g., FIG. 14) can be employed whereby the program operation can be determined/selected to be a weak program operation, as opposed to a regular program operation, or relative to a strong program operation. For example, the "weak" program operation can include a lower word line level (e.g., about 0.5 V), as compared to a "strong" program operation having a word line level of about 1 V. Other option variables used to implement strong/weak program operations can include pulse widths, program voltages via word lines and bit lines, currents, or any suitable parameter in order to produce the desired weak program effect on the selected memory cell.

A read operation in order to verify whether the weak program operation successfully programmed the memory cell can be performed at 1018, and the flow can complete at 1020. As part of the verify operation, the resistance of the memory cell can effectively be compared against a target resistance (e.g., about 50 kΩ), such that if the determined resistance value is less than or about equal to the target resistance, then the memory cell may be deemed to have been successfully strong programmed. In this particular example, weak program operation 1000 can thus include determining the operation at 1010, performing one or more erase operations at 1012, performing one or more erase verify operations at 1014, performing one or more "weak" program operations at 1016, and performing one or more weak program verify operations at 1018.

Various approaches can be employed in order to control the weak and strong programmed states. For example, the word line voltage can be controlled during the program operation in order to ensure that bits do not get over-programmed (e.g., to a resistance substantially less than about 50 kΩ) as part of a weak program operation. Such over-programming during the weak program operation could result in reduction of the margin between weak and strong programmed states. Generally, the word line can be controlled to be about 1 V for a low resistance (e.g., about 10 kΩ) from a strong program operation, and the word line can be controlled to be about 0.5 V for a higher resistance (e.g., about 50 kΩ) from a weak program operation. Of course, other word line voltages, as well as dynamic control of the word line voltages, can be employed in certain embodiments.

In particular embodiments, a dual program state cycling algorithm can include a strong program operation, followed by a read/verify of the strong program operation, followed by an erase operation, followed by a read/verify of the erase operation, followed by a weak program operation, and followed by a read/verify of the weak program operation. Of course, each of the "operations" can actually include a plurality of operations, such as a plurality of program pulses in order to execute a given program operation. In addition, a regular erase operation can precede a given weak program operation as shown in the example of FIG. 10, and/or may proceed each of the weak and strong program operations.

The command (e.g., from a host) detected as a write command can be executed by way of one or more of a strong program operation, a weak program operation, and an erase operation, all with associated verify operations. For example, an erase command received from a host can be executed per the flow of FIG. 10 including a regular erase operation followed by a weak program operation, and a program command can be executed per the flow of FIG. 9 including a strong program operation. As discussed above, the weak and strong program operations can result in two separate programmed states (e.g., logic data states "1" and "0"), and the erase operation can result in a third state (e.g., a third logic/data state or a don't care state). In some cases, however, the erase operation may strictly be used as a precursor to a given strong/weak program operation, and may not necessarily represent a data state in and of itself. In other cases, the erase operation can represent and result in a third data state as discussed above, while two data states can result from the program operations (e.g., weak or strong).

Figure 11:
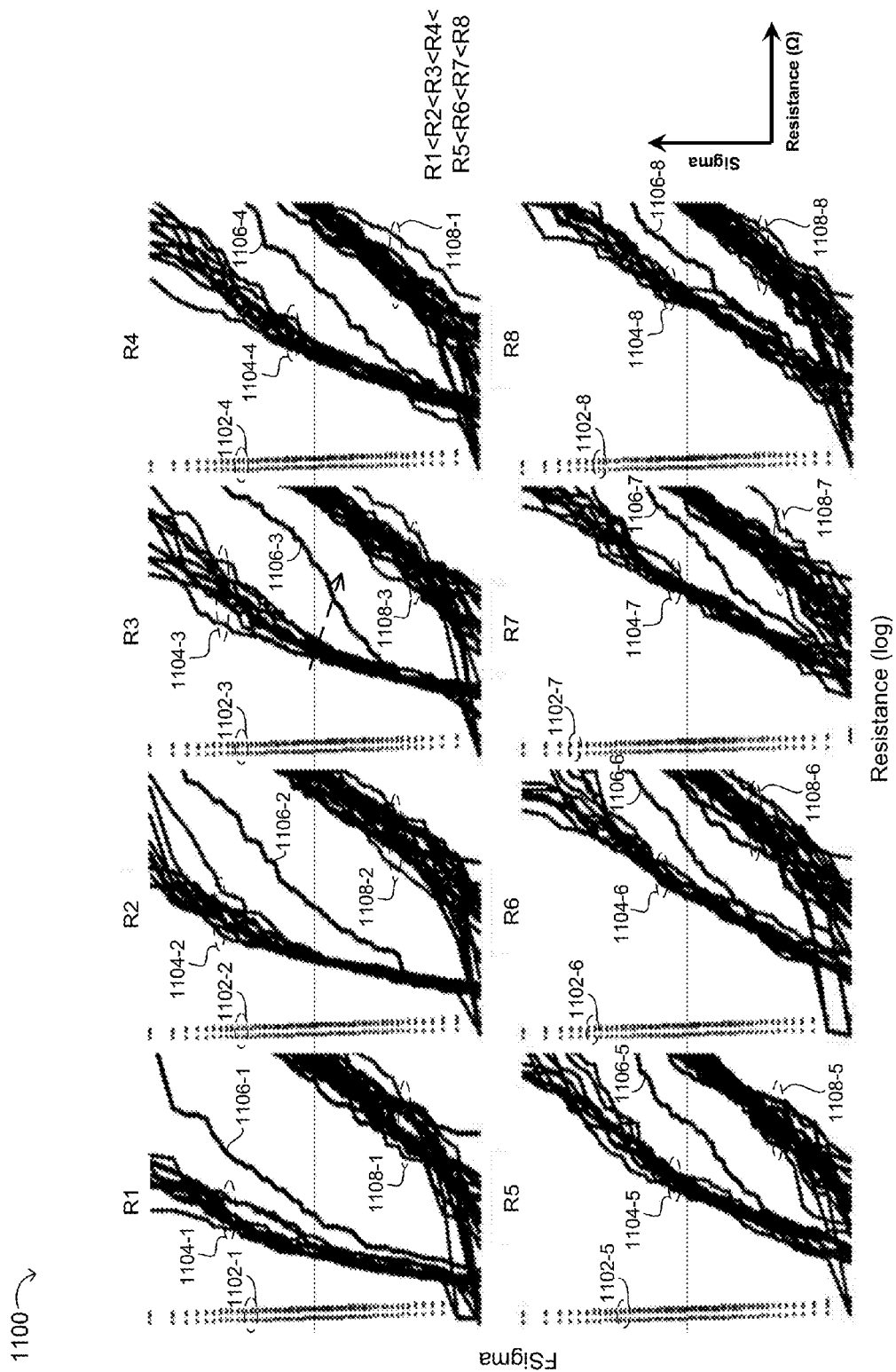
FIG. 11 is a diagram of example dual program states with multiple second program verify operations, in accordance with embodiments of the present invention.

Referring now to FIG. 11, shown is a diagram 1100 of example dual program states with multiple second program verify operations, in accordance with embodiments of the present invention. The weak programmed resistances increase in going from left to right in the diagrams. Here, 1102 can represent a strong first programmed state, 1104 can represent a weak second programmed state, 1106 can represent an after SMT version of a weak second programmed state, and 1108 can represent an erased state after the first or second program operation.

Figure 12:
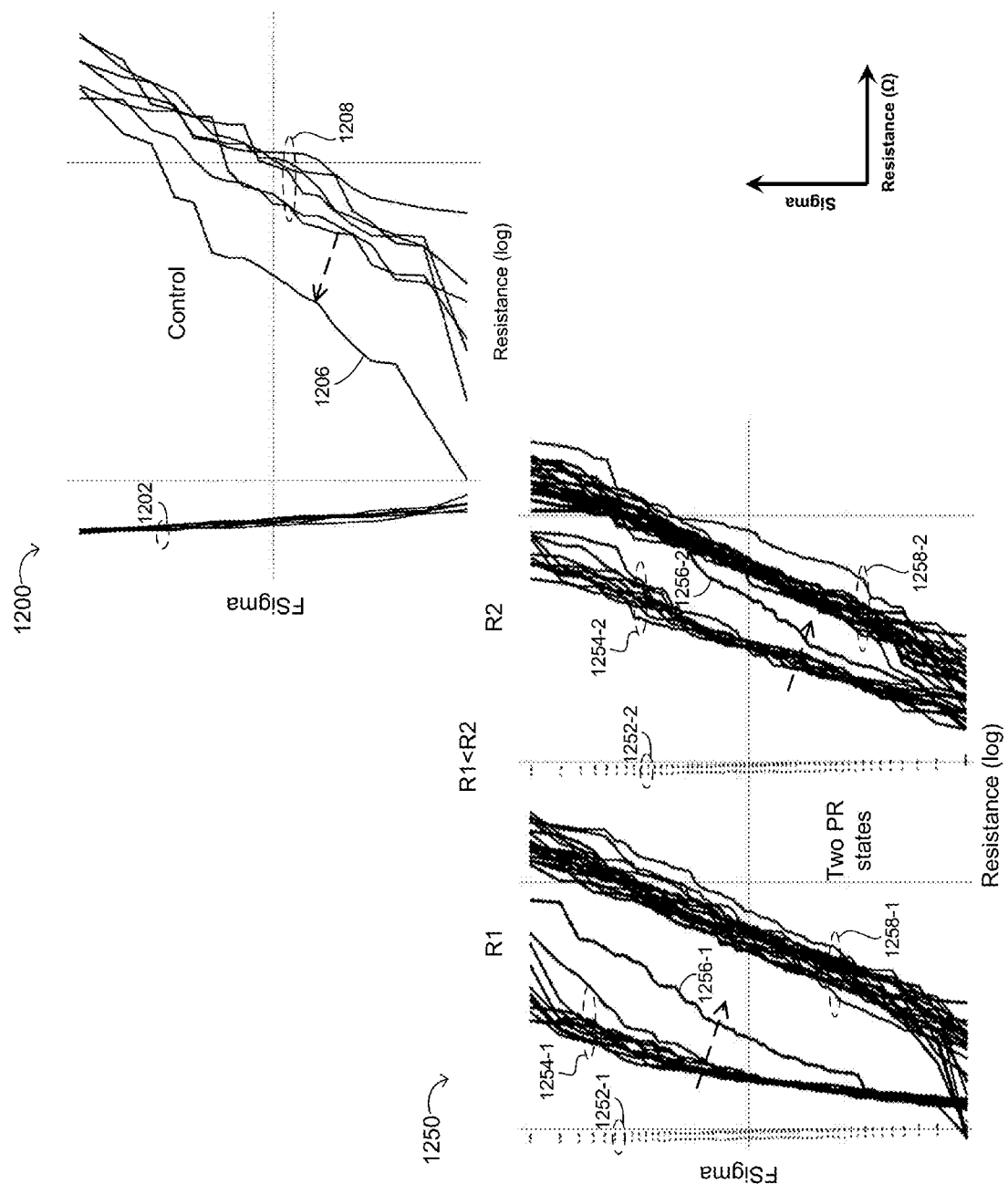
FIG. 12 is a diagram of example dual program states versus control erase operations, in accordance with embodiments of the present invention.

Referring now to FIG. 12, shown is a diagram of example dual program states versus control erase operations, in accordance with embodiments of the present invention. Diagram 1200 shows example control/erase resistances, and diagram 1250 shows example dual programmed states resulting from weak and strong program operations. In diagram 1200, 1202 can represent a programmed state, 1206 can represent an erase state after SMT, and 1208 can represent an erased state before SMT. In diagram 1250, 1252 can represent a strong first programmed state, 1254 can represent a weak second programmed state, 1256 can represent a weak second programmed state after SMT, and 1258 can represent an erased state after the first or second program operation.

Figure 13:
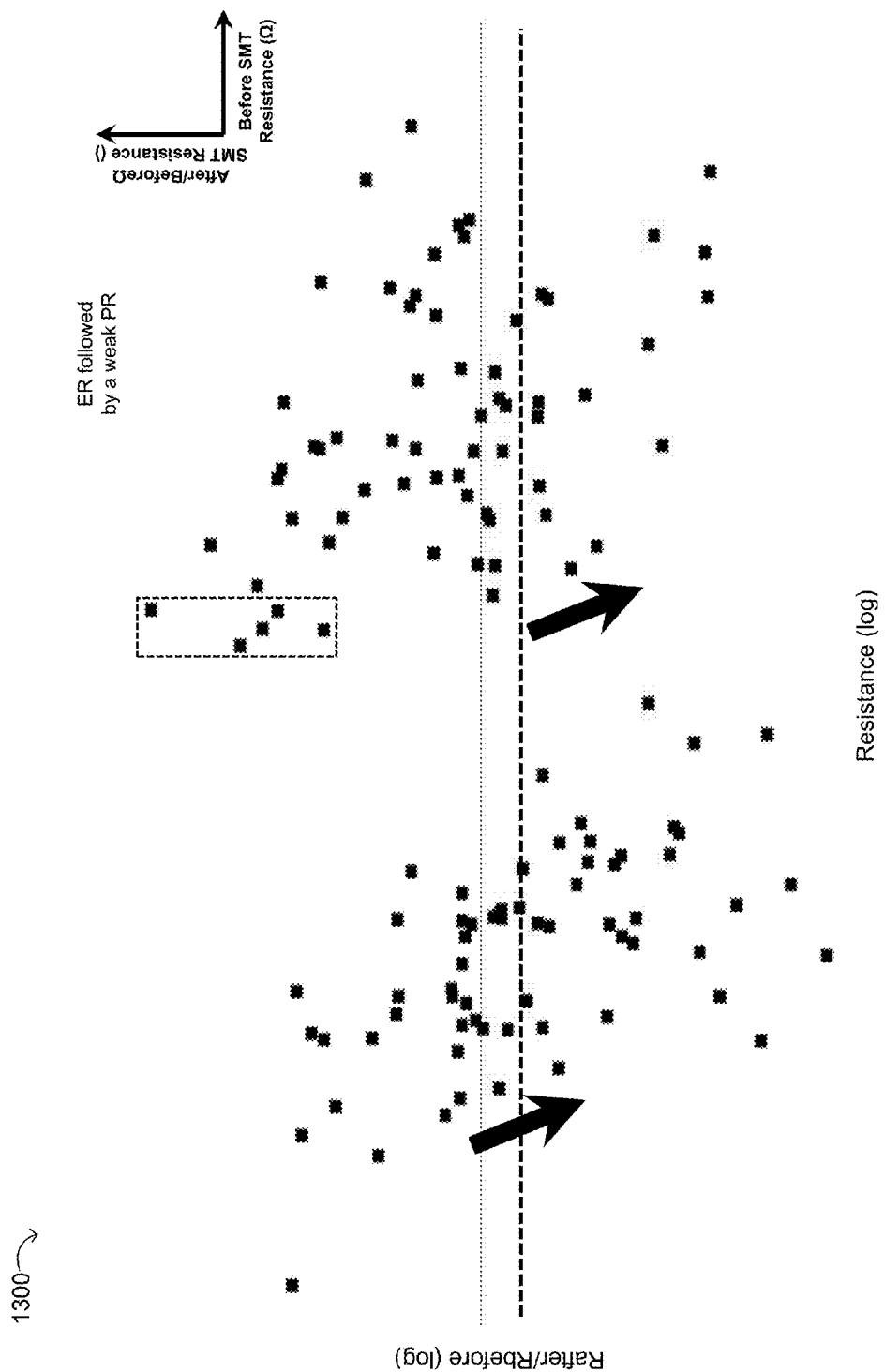
FIG. 13 is another diagram of example dual program states versus control erase operations, in accordance with embodiments of the present invention.
Figure 14:
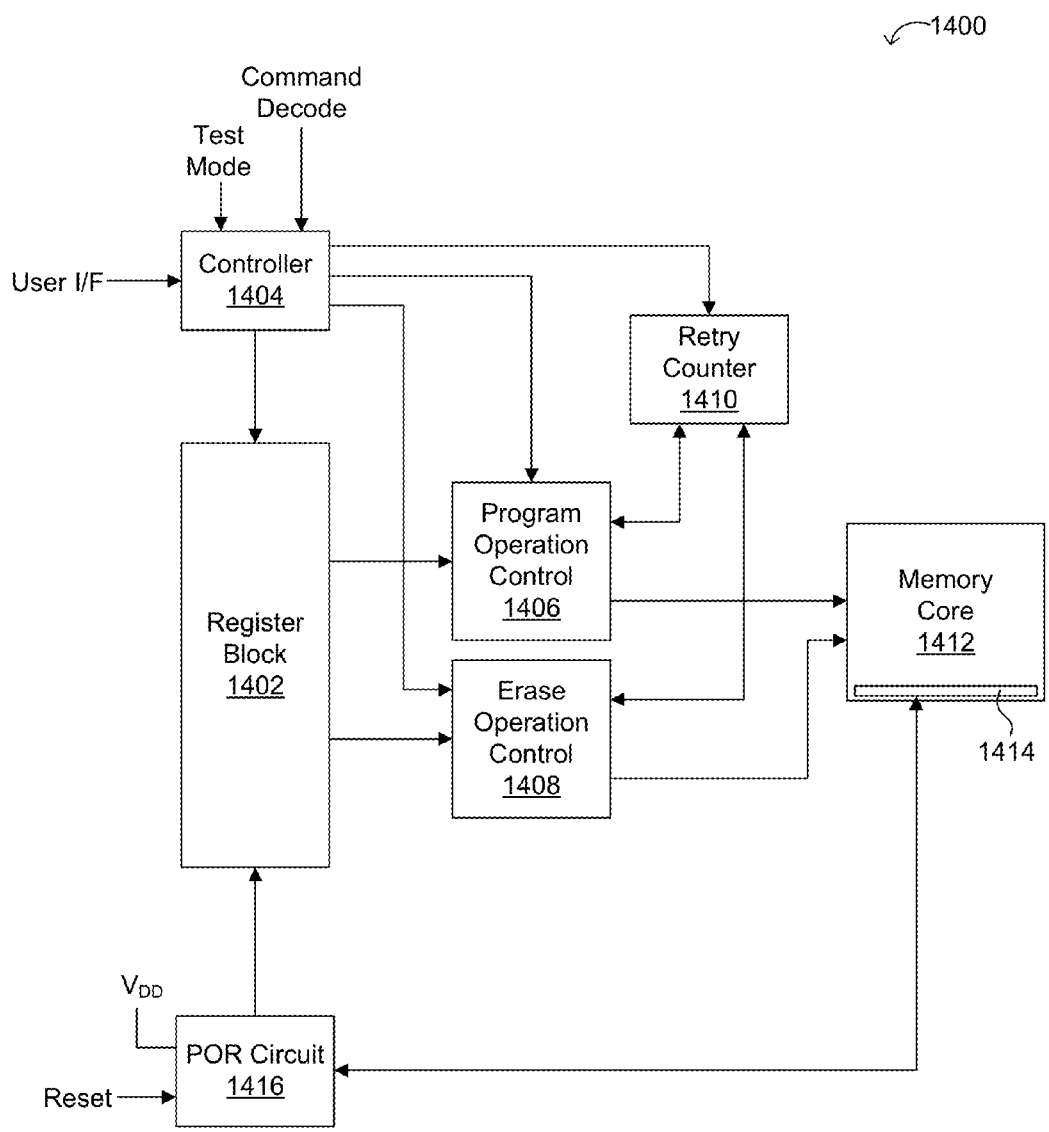
FIG. 14 is a schematic block diagram of an example register, control, and memory array structure, in accordance with embodiments of the present invention.

Referring now to FIG. 13, shown is another diagram 1300 of example dual program states versus control erase operations, in accordance with embodiments of the present invention. For example, the population may be 64 bits per group, and the dashed box may indicate example over-programmed bits, which can be addressed by a modified weak program retry algorithm. As shown in this particular example, about 50% of erased bits may reduce in resistance after an SMT process, and only about 25% of weakly programmed, after an erase operation, bits may reduce in resistance after an SMT process Referring now to FIG. 14, shown is a schematic block diagram 1400 of an example register, control, and memory array structure, in accordance with embodiments of the present invention. For example, register block 1402 can be implemented using static random access memory (SRAM). Register block 1402 can provide algorithm and option variable selections to program operation control 1406 and erase operation control 1408. Controller 1404 may determine and decode the received command, and can also control access to the register bits in register block 1402. In addition, test modes (e.g., to determine distribution, etc.) can be used to override data in register block 1402. Settings for register block 1402 may be based on various default algorithm and option variable or condition settings, but can also be programmed on lot-by-lot or device-by-device basis. Also, values for program operations, erase operations, and option variable or related condition settings, can be independently programmed in register block 1402.

Power on reset (POR) circuitry or state machine 1416, which can receive a reset signal, can access designated register data portion 1414 and read out data from that dedicated section of memory array 1412. Designated register data portion 1414 may alternatively be located outside of memory core 1412. In any event, this accessed data that is associated with memory core 1412 may then be loaded into register block 1402. In this way, information specific to this device can be programmed into the memory core, and whenever the device is powered on (e.g., as detected by $V_{DD}$ supply) or otherwise reset, this data can be loaded into register 1402. This is because the memory core, including designated register data portion 1414 may include non-volatile memory. Also, different applications-based information can be stored in non-volatile memory designated register data portion 1414. Further, different parts or memory cores 1412 can be independently programmed (e.g., for different applications, etc.). In some cases, this dedicated portion of memory may not be accessible to the user. However, some applications may allow access to these designated locations, such as in a test mode.

Also, the non-volatile memory cells in designated register data portion 1414 may be substantially identical to those in a remaining portion of memory core 1412. For example, memory core 1412 can include a plurality of memory cells that each can include a programmable impedance element or PMC. However, in some cases there may be some variety between the cells (e.g., programmable impedance element-based cells) of designated register data portion 1414 relative to the cells found in other portions of memory core 1412. For example, the cells of designated register data portion 1414 may have a substantially similar structure relative to the other cells, but in order to accommodate higher retention for the critical data stored therein, the cells of designated register data portion 1414 may be varied so as to provide improved retention.

In one or more test modes, controller 1404 can override one or more values stored in register 1402. When the test mode is complete, data in register block 1402 can revert to the data that was previously stored in the register. For example, registers 1402 may be implemented as two storage bits per register cell, one such bit representing an override value that is only enabled during predetermined modes (e.g., test mode, etc.), and another bit storing the data programmed outside of the test mode (e.g., during normal operation, power up, etc.). As another example, registers 1402 may be implemented as a single bit per cell or stored data bit, and data can be reverted to its previous state by accessing designated register data portion 1414 and asserting the reset signal upon completion of the test mode.

In addition, registers 1402 may be programmable by controller 1404 and/or by a user via a separate or combined user interface. In this way, a user may be able to program data into registers 1402 in order to override or change previous values therein. Particular embodiments may also support independently controlled program/erase algorithm selection for different memory cores 1412. For example, controller 1404 can set the register values in 1402 different for different memory cores 1412. For example, register block 1402 may include dedicated sectors (e.g., a widened register or increased register bit length) for each memory core, or register block 1402 may be replicated for each memory core 1412. This may be utilized whereby one memory array 1412 is dedicated to one application (e.g., code), while another memory array 1412 may be dedicated to another application (e.g., data). In this way, register block 1402 may accommodate independently programmable operation algorithms in support of different operations for different memory cores 1412.

Various program/erase operation algorithm information can be stored in register block 1402. Option variables that define conditions (e.g., pulse widths, voltage levels, current levels, etc.) for the program (e.g., strong versus weak program operations) and erase operations of the selected operation algorithm may also be defined in register block 1402. In addition, a maximum number of retry attempts, which may be embedded within one or more of the program/erase algorithms may also be stored in register block 1402. For example, retry counter 1410 may keep track of a number of attempts for a given program or erase operation, or a sequence of program and/or erase operations, as part of a selected program/erase operation algorithm.

Particular embodiments may also support dynamically changing the operation algorithm as the semiconductor device ages, or arrays thereof are cycled more and more. For example, counters may be used to move to different algorithm and/or option variable selections and effectively change the program/erase algorithms to be used based on the counter results. In one example, designated register data portion 1414 can be updated to reflect changed algorithm selections, option variables, etc., values based on such counter results. As a result, register block 1402 can be updated via POR circuit 1416, as discussed above. In another example, incremented values based on the counter results can be dynamically determined based on data output from register block 1402. In this case, data that is read from register block 1402 can then be updated by subsequent circuitry based on the counter results, before being provided as outputs to program operation control 1406 and erase operation control 1408.

Other fields (not shown) may be used to indicate option variables to set conditions for the various algorithms. Various fields of register block 1402 may generally be used to form or support a conditions table that may be accessed (e.g., by program operation control 1406, erase operation control 1408, etc.) to set the conditions for one or more of the program and erase operations of a selected operation algorithm. For example, 24 registers can be included, where each register is 8-bits wide. In addition, such registers may support other programmable impedance device-based functions, such as word line voltage level, compliance current (e.g., where the cell is programmed until reaching this compliance current, X μA), equalization pulse width, single ended or differential sense amplifier configuration, as well as any number of other device functions and/or parameters.

It is also noted that, while two storage states (state "0" and state "1") have been significantly described herein with respect to program and erase operations, as well as weak and strong program operations, more than two memory states can also be supported. For example, depending on the voltage level controls, instead of a full erase or a full program/write, partial or weaker operations (e.g., by applying less/predetermined voltages for forward bias and reverse bias of the PMC) can be performed. Such partial operations can produce different resistance values in the cell, as opposed to the cell having an on/off resistance corresponding to two storage states. Instead, a binary coding of, e.g., eight different bands or ranges of cell on resistances can be converted into 3-bit storage values. Thus in this example, eight different data values can be stored in a given resistive memory cell. Of course, other numbers of data values can be stored based on the resistance and bias voltage characteristics.

While the above examples include circuit, operational, and structural implementations of certain memory cells and programmable impedance devices, one skilled in the art will recognize that other technologies and/or cell structures can be used in accordance with embodiments. Further, one skilled in the art will recognize that other device circuit arrangements, architectures, elements, and the like, may also be used in accordance with embodiments. Further, the resistance levels, operating conditions, and the like, may be dependent on the retention, endurance, switching speed, and variation requirements of a programmable impedance element.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A method of controlling a resistive switching memory cell, the method comprising:
   a) receiving a first command to be executed on the resistive switching memory cell;
   b) performing, in response to the first command, an erase operation to erase the resistive switching memory cell to an erased state;
   c) verifying the erased state of the resistive switching memory cell;
   d) performing a weak program operation to program the resistive switching memory cell to a first programmed state; and
   e) verifying the first programmed state of the resistive switching memory cell.

2. The method of claim 1, wherein the weak program operation comprises selecting an option variable for at least one of pulse widths, voltages, and currents.

3. The method of claim 1, wherein the first command comprises an erase command.

4. The method of claim 1, wherein the first programmed state comprises a cell resistance of about 50 kΩ.

5. The method of claim 1, wherein the first programmed state is designated as a logic data state, and the erased state is designated as a don't care state.

6. The method of claim 1, wherein the verifying the first programmed state comprises:
   a) reading the resistive switching memory cell;
   b) measuring a cell resistance of the resistive switching memory cell in response to the reading; and
   c) comparing the cell resistance against a predetermined weak resistance to determine if the cell resistance is less than the predetermined weak resistance.

7. The method of claim 1, further comprising:
   a) receiving a second command to be executed on the resistive switching memory cell;
   b) performing, in response to the second command, a strong program operation to program the resistive switching memory cell to a second programmed state; and
   c) verifying the second programmed state of the resistive switching memory cell.

8. The method of claim 7, wherein:
   a) the performing the weak program operation comprises activating a word line of the resistive switching memory cell to a first word line voltage; and
   b) the performing the strong program operation comprises activating the word line to a second word line voltage, wherein the second word line voltage is greater than the first word line voltage.

9. The method of claim 7, wherein the strong program operation comprises selecting an option variable for at least one of pulse widths, voltages, and currents.

10. The method of claim 7, wherein the second command comprises a program command.

11. The method of claim 7, wherein the first programmed state comprises a cell resistance of about 10 kΩ.

12. The method of claim 7, wherein the first programmed state is designated as a first logic data state, and the second programmed state is designated as a second logic data state.

13. The method of claim 12, wherein the erased state is designated as a don't care state.

14. The method of claim 12, wherein the erased state is designated as a third logic data state.

15. A resistive switching memory device, comprising:
   a) a command decoder configured to decode a first command to be executed on a resistive switching memory cell;
   b) an erase controller configured to perform, in response to the first command, an erase operation to erase the resistive switching memory cell to an erased state;
   c) a program controller configured to perform a weak program operation to program the resistive switching memory cell to a first programmed state; and
   d) a sense amplifier configured to verify the erased state of the resistive switching memory cell in response to the erase operation, and to verify the first programmed state in response to the weak program operation.

16. The resistive switching memory device of claim 15, wherein:
   a) the command decoder is configured to decode a second command to be executed on the resistive switching memory cell;
   b) the program controller is configured to perform a strong program operation to program the resistive switching memory cell to a second programmed state; and
   c) the sense amplifier is configured to verify the second programmed state in response to the strong program operation.

17. The resistive switching memory device of claim 16, further comprising a word line driver configured to:
   a) activate a word line of the resistive switching memory cell to a first word line voltage to perform the weak program operation; and
   b) activate the word line to a second word line voltage to perform the strong program operation, wherein the second word line voltage is greater than the first word line voltage.

18. The resistive switching memory device of claim 15, wherein the resistive switching memory cell comprises a programmable impedance element having:
   a) an inert electrode coupled to a first side of a solid electrolyte;
   b) an active electrode coupled to a second side of the solid electrolyte, wherein the programmable impedance element is programmed by formation of a conductive path between the active and inert electrodes; and
   c) a plurality of mobile elements derived from the active electrode, wherein the plurality of mobile elements are reduced in the solid electrolyte to form the conductive path.

19. The resistive switching memory device of claim 18, wherein the conductive path in the programmable impedance element is formed by application of a first voltage across the active and inert electrodes, the conductive path remaining once formed after the first voltage is removed.

20. The resistive switching memory device of claim 18, wherein at least a portion of the conductive path is dissolved to erase the programmable impedance element by application of a second voltage across the active and inert electrodes.

* * * * *